(12) United States Patent
Chang et al.

(10) Patent No.: US 7,576,597 B2
(45) Date of Patent: Aug. 18, 2009

(54) ELECTRONIC DEVICE AND RELATED METHOD FOR PERFORMING COMPENSATION OPERATION ON ELECTRONIC ELEMENT

(75) Inventors: Yen-An Chang, Miaoli County (TW); Der-Min Yuan, Taipei County (TW)

(73) Assignee: Etron Technology, Inc., Hsinchu (TW)

( * ) Notice: Subject to any disclaimer, the term of this patent is extended or adjusted under 35 U.S.C. 154(b) by 28 days.

(21) Appl. No.: 11/968,660

(22) Filed: Jan. 3, 2008

(65) Prior Publication Data

US 2008/0303559 A1     Dec. 11, 2008

(30) Foreign Application Priority Data

Jun. 5, 2007    (TW) .............................. 96120232 A

(51) Int. Cl.
*G05F 1/10*  (2006.01)
(52) U.S. Cl. ....................................... 327/538; 327/513
(58) Field of Classification Search ................ 327/512, 327/513, 535, 537, 538, 539, 543
See application file for complete search history.

(56) References Cited

U.S. PATENT DOCUMENTS

| | | | |
|---|---|---|---|
| 5,818,294 A * | 10/1998 | Ashmore, Jr. ................ | 327/543 |
| 6,531,911 B1 * | 3/2003 | Hsu et al. .................... | 327/512 |
| 7,218,167 B2 * | 5/2007 | Chatal et al. ................. | 327/539 |
| 7,417,490 B2 * | 8/2008 | Kim ............................ | 327/534 |

* cited by examiner

*Primary Examiner*—Jeffrey S Zweizig
(74) *Attorney, Agent, or Firm*—Winston Hsu

(57) ABSTRACT

The present invention discloses an electronic device and related method for performing a compensation operation on an electronic element, wherein the electronic device includes: a control module, for outputting a control signal according to an input signal; a driver module, coupled to the control module and the electronic element, for providing a driving current to the electronic element according to the control signal; a sensor module, for outputting at least a sensor signal according to a variation of an operation environment; a compensation control module, coupled to the sensor module, for outputting at least a compensation control signal according to the at least a sensor signal and the input signal; and a compensation driver module, coupled to the electronic element and the compensation control module, for providing at least a compensation driving current to the electronic element according to the at least a compensation control signal.

10 Claims, 3 Drawing Sheets

ELECTRONIC DEVICE AND RELATED METHOD FOR PERFORMING COMPENSATION OPERATION ON ELECTRONIC ELEMENT

BACKGROUND OF THE INVENTION

1. Field of the Invention

The present invention relates to an electronic device for performing a compensation operation on an electronic element, and more particularly, to an electronic device for performing a compensation operation on a memory array circuit.

2. Description of the Prior Art

Please refer to FIG. 1. FIG. 1 shows a simplified block diagram of an electronic device 100 for performing a driving operation on a memory array circuit 10 according to a prior art. As shown in FIG. 1, the electronic device 100 includes a control unit 110 and a driver unit 120, wherein the control unit 110 is utilized for outputting a control signal Sc according to an input signal Sa, and the driver unit 120 is coupled between the control unit 110, the memory array circuit 10, and an operation voltage source Vo of the memory array circuit 10, and utilized for providing a driving current to the memory array circuit 10 according to the control signal Sc. However, when a voltage level of the operation voltage source Vo or an operation environment temperature of the memory array circuit 10 changes, the driving current will also change and possibly result in variations of the driving ability of the electronic device 100 for the memory array circuit 10, and will even further affect the electric performance of the memory array circuit 10 seriously. For example,

SUMMARY OF THE INVENTION

It is therefore one of the objectives of the present invention to provide an electronic device for performing a compensation operation on a memory array circuit to solve the above problem.

According to an embodiment of the present invention, an electronic device for performing a compensation operation on an electronic element is disclosed. The electronic device includes: a control module, for outputting a control signal according to an input signal; a driver module, coupled to the control module and the electronic element, for providing a driving current to the electronic element according to the control signal; a sensor module, for outputting at least a sensor signal according to a variation of an operation environment; a compensation control module, coupled to the sensor module, for outputting at least a compensation control signal according to the at least a sensor signal and the control signal; and a compensation driver module, coupled to the electronic element and the compensation control module, for providing at least a compensation driving current to the electronic element according to the at least a compensation control signal.

According to an embodiment of the present invention, a method for performing a compensation operation on an electronic element is further disclosed. The method includes: outputting a control signal according to an input signal; providing a driving current to the electronic element according to the control signal; outputting at least a sensor signal according to a variation of an operation environment; outputting at least a compensation control signal according to the at least a sensor signal and the control signal; and providing at least a compensation driving current to the electronic element according to the at least a compensation control signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, hardware manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ". The terms "couple" and "coupled" are intended to mean either an indirect or a direct electrical connection. Thus, if a first device couples to a second device, that connection may be through a direct electrical connection, or through an indirect electrical connection via other devices and connections.

The present invention relates to an electronic device and related method for performing a compensation operation on an electronic element. This document will describe several exemplary embodiments that apply the electronic device and related method in the present invention. However, a person of average skill in the pertinent art should understand that the present invention can be applied for various types of electronic device and is not limited to the particular embodiments described in the following paragraphs or to the particular manner in which any features of such embodiments are implemented.

In general, the present invention is applicable to all kinds of electronic elements. By way of example but not limitation, an electronic device and related method implemented for a memory array circuit in accordance with the present invention is disclosed. In addition, under conditions of not affecting the technical disclosure of the present invention, a memory array circuit will be used as an example to illustrate the electronic device and related method of the present invention.

Figure 1:
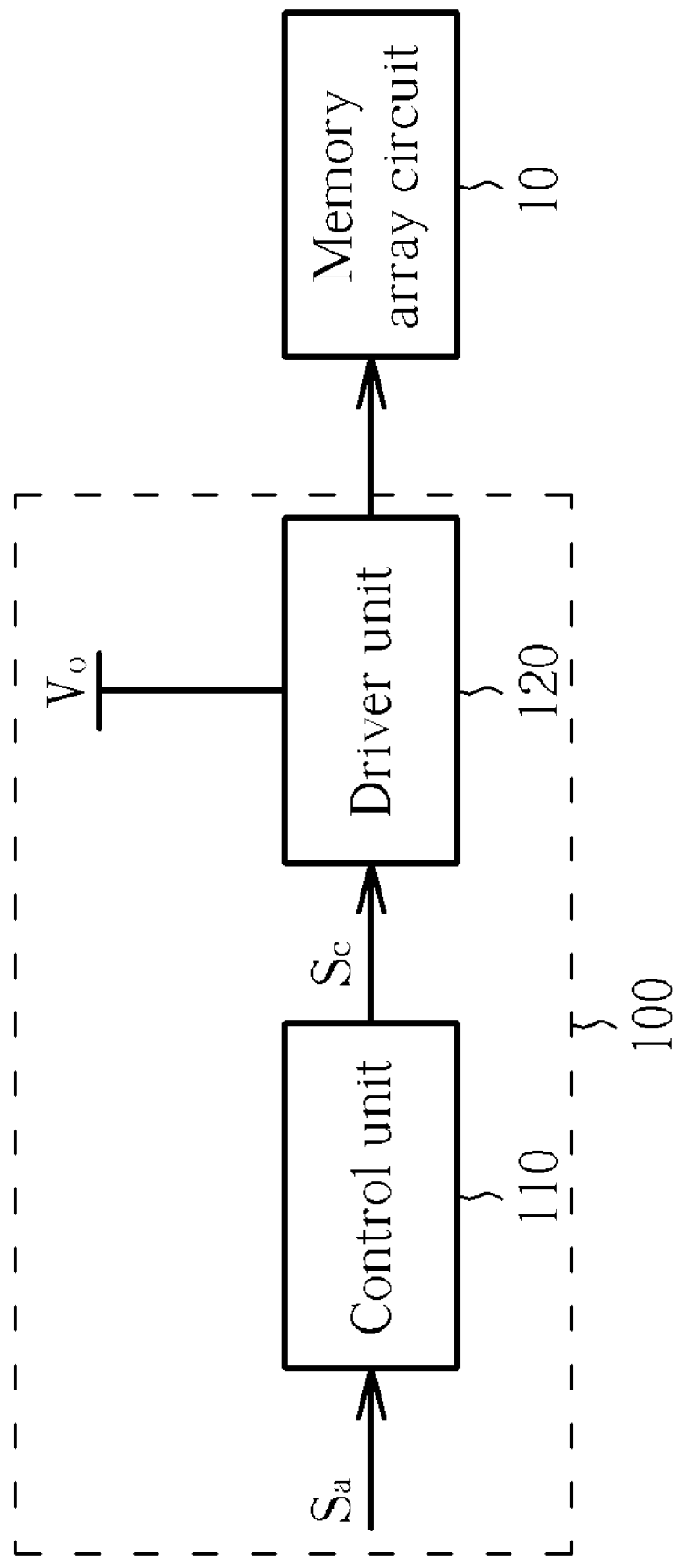
FIG. 1 shows a simplified block diagram of an electronic device for performing a driving operation on a memory array circuit according to a prior art.
Figure 2:
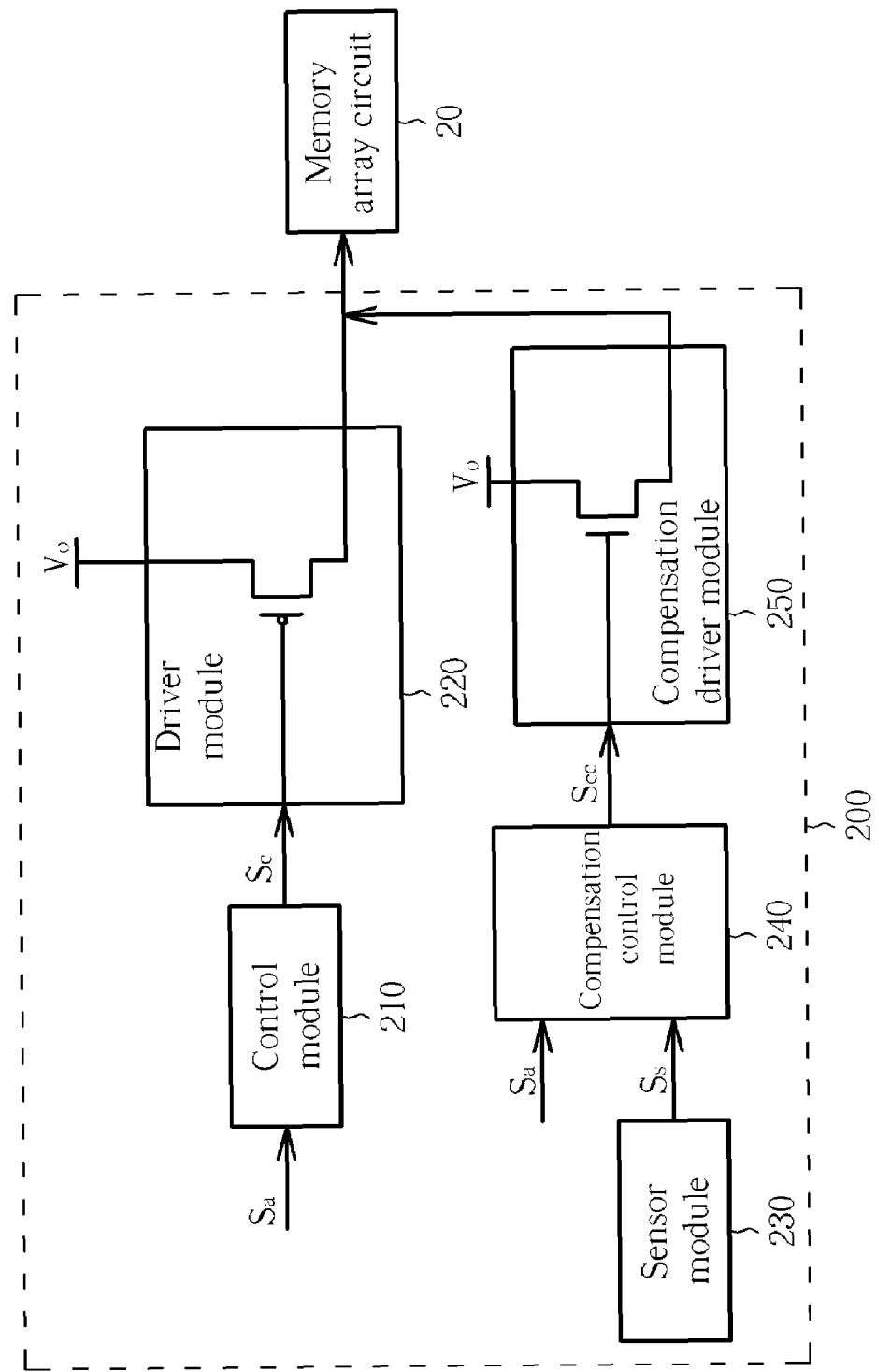
FIG. 2 shows a simplified block diagram of an electronic device for performing a compensation operation on a memory array circuit according to an embodiment of the present invention.

Please refer to FIG. 2. FIG. 2 shows a simplified block diagram of an electronic device 200 for performing a compensation operation on a memory array circuit 20 according to an embodiment of the present invention. As shown in FIG. 2, the electronic device 200 includes a control module 210, a driver module 220, a sensor module 230, a compensation control module 240, and a compensation driver module 250. The control module 210 is utilized for outputting a control signal Sc according to an input signal Sa. The driver module 220 is coupled between the control module 210, the memory array circuit 20, and an operation voltage source Vo of the memory array circuit 20, and utilized for providing a driving current to the memory array circuit 20 according to the control signal Sc. The sensor module 230 is utilized for outputting at least a sensor signal Ss according to a variation of an operation environment. In an embodiment of the present invention, for example, the variation of the operation environment can be a voltage level variation of the operation voltage source Vo of the memory array circuit 20, and the sensor module 230 can include a voltage sensor (not shown) for outputting a voltage sensor signal according to the voltage level variation of the operation voltage source Vo. In another embodiment of the present invention, the variation of the operation environment can be an operation environment temperature variation of the memory array circuit 20, and the sensor module 230 can include a temperature sensor (not shown) for outputting a temperature sensor signal according to the operation environment temperature variation. In addition, in another embodiment of the present invention, the variation of the operation environment can be the voltage level variation of the operation voltage source Vo of the memory array circuit 20 and the operation environment temperature variation simultaneously, and the sensor module 230 can include the voltage sensor and the temperature sensor above, for outputting a voltage sensor signal according to the voltage level variation of the operation voltage source Vo and outputting a temperature sensor signal according to the operation environment temperature variation. However, please note that the above embodiments are only for illustration purposes and are not meant to be limitations of the present invention.

The compensation control module 240 is coupled to the sensor module 230, and utilized for outputting at least a compensation control signal Scc according to the sensor signal Ss and the control signal Sa. The compensation driver module 250 is coupled between the compensation control module 240, the memory array circuit 20, and the operation voltage source Vo of the memory array circuit 20, and is utilized for providing at least a compensation driving current to the memory array circuit 20 according to the compensation control signal Scc. For example, when the voltage level of the operation voltage source Vo decreases or increases, the original driving current provided by the driver module 220 will also decrease or increase accordingly, and thus the compensation driver module 250 will provide at least a compensation driving current to the memory array circuit 20 according to the compensation control signal Scc, so as to maintain a required normal driving current for driving the memory array circuit 20. In addition, since the threshold voltage of the CMOSFET included in the memory array circuit 20 will increase when the junction temperature of the CMOSFET declines, thus it will be more difficult for the transition of the CMOSFET under the condition of the same driving current. Thus, when the operation environment temperature of the memory array circuit 20 declines, the required driving current for driving the memory array circuit 20 will increase, and then the compensation driver module 250 will provide at least a compensation driving current to the memory array circuit 20 according to the compensation control signal Scc, so as to maintain the required normal driving current for driving the memory array circuit 20. Thus, the electronic device 200 disclosed by the present invention can prevent the voltage level variation of the operation voltage source Vo of the memory array circuit 20 and/or the operation environment temperature variation of the memory array circuit 20 from affecting the electric performance of the memory array circuit 20.

In the embodiment in FIG. 2 of the present invention, the driver module 220 includes a PMOSFET, and the compensation driver module 250 includes a NMOSFET. However, this is only for illustration purposes and is not meant to be a limitation of the present invention. For example, in another embodiment of the present invention, the compensation driver module 250 also can include a plurality of compensation driver units (such as the NMOSFETs or the PMOSFETs), and the compensation control module 240 also can include a plurality of compensation control units for respectively outputting a plurality of compensation control signal to the plurality of compensation driver units to control the plurality of compensation driver units to respectively output the at least a compensation control signal to the memory array circuit 20.

Figure 3:
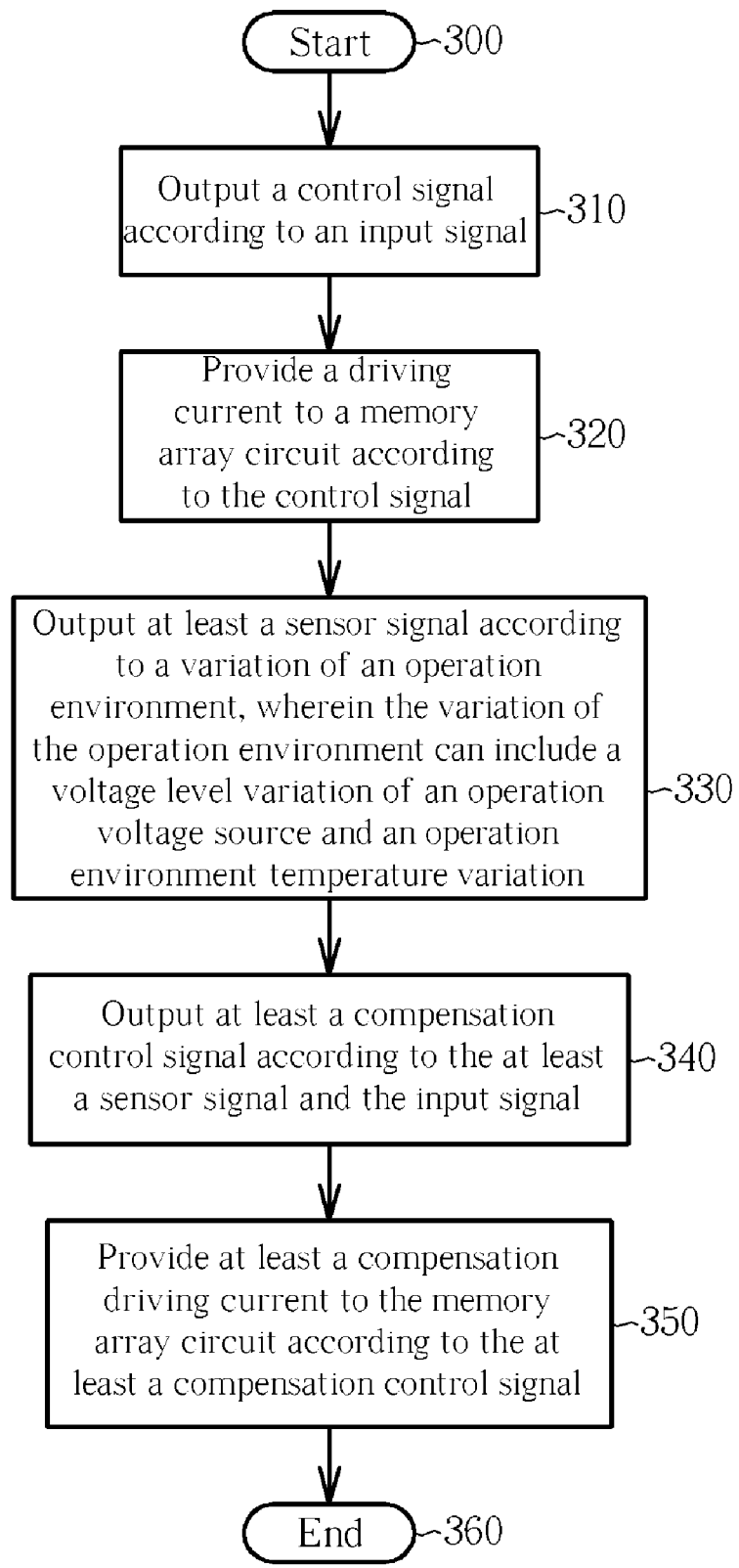
FIG. 3 is a flowchart showing an exemplary method for performing a compensation operation on an electronic element (such as a memory array circuit) according to the operation schemes of the electronic devices in the above embodiments of the present invention.

Please refer to FIG. 3. FIG. 3 is a flowchart showing an exemplary method for performing a compensation operation on an electronic element (such as a memory array circuit) according to the operation schemes of the electronic devices in the above embodiments of the present invention. Provided that substantially the same result is achieved, the steps of the process flowchart need not be in the exact order shown and need not be contiguous, that is, other steps can be intermediate. The method according to an embodiment of the present invention includes the following steps:

Step 300: Start.

Step 310: Output a control signal according to an input signal.

Step 320: Provide a driving current to a memory array circuit according to the control signal.

Step 330: Output at least a sensor signal according to a variation of an operation environment, wherein the variation of the operation environment can include a voltage level variation of an operation voltage source and an operation environment temperature variation of the memory array circuit.

Step 340: Output at least a compensation control signal according to the at least a sensor signal and the input signal.

Step 350: Provide at least a compensation driving current to the memory array circuit according to the at least a compensation control signal.

Step 360: End.

Briefly summarized, when the voltage level of the operation voltage source Vo of the memory array circuit 20 and/or an operation environment temperature of the memory array circuit 20 changes, the electronic device 200 disclosed by the present invention can utilize the sensor module 230 to detect the above variations affecting the original driving current in real time and output at least a sensor signal, and then utilize the compensation control module 240 to output at least a compensation control signal according to the at least a sensor signal and an input signal. Next, the electronic device 200 will utilize the compensation driver module 250 to provide at least a compensation driving current to the memory array circuit 20 according to the at least a compensation control signal, so as to prevent the voltage level variation of the operation voltage source Vo of the memory array circuit 20 and/or the operation environment temperature variation of the memory array circuit 20 from affecting the electric performance of the memory array circuit 20.

Those skilled in the art will readily observe that numerous modifications and alterations of the device and method may be made while retaining the teachings of the invention.

What is claimed is:

1. An electronic device for performing a compensation operation on an electronic element, the electronic device comprising:

a control module, for outputting a control signal according to an input signal;

a driver module, coupled to the control module and the electronic element, for providing a driving current to the electronic element according to the control signal;

a sensor module, for outputting at least a sensor signal according to a variation of an operation environment;

a compensation control module, coupled to the sensor module, comprising a plurality of compensation control units for respectively outputting a plurality of compensation control signals according to the at least a sensor signal and the input signal; and a compensation driver module, coupled to the electronic element and the compensation control module, comprising a plurality of compensation driver units for respectively providing at least a compensation driving current to the electronic element according to the compensation control signals.

2. The electronic device of claim 1, wherein the variation of the operation environment is a voltage level variation of an operation voltage source of the electronic device, and the sensor module comprises a voltage sensor for outputting the sensor signal according to the voltage level variation of the operation voltage source.

3. The electronic device of claim 1, wherein the variation of the operation environment is an operation environment temperature variation of the electronic device, and the sensor module comprises a temperature sensor for outputting the sensor signal according to the operation environment temperature variation.

4. The electronic device of claim 1, wherein the plurality of compensation driver units are a plurality of transistors.

5. The electronic device of claim 4, wherein the plurality of transistors comprise N type field effect transistors (FETs) or P type FETs.

6. The electronic device of claim 1, wherein the electronic element comprises a memory array circuit.

7. A method for performing a compensation operation on an electronic element, the method comprising:

outputting a control signal according to an input signal;

providing a driving current to the electronic element according to the control signal;

outputting at least a sensor signal according to a variation of an operation environment;

outputting a plurality of compensation control signals according to the at least a sensor signal and the input signal; and respectively providing at least a compensation driving current to the electronic element according to the compensation control signals.

8. The method of claim 7, wherein the step of outputting the at least a sensor signal according to the variation of the operation environment further comprises:

outputting the sensor signal according to a voltage level variation of an operation voltage source.

9. The method of claim 7, wherein the step of outputting the at least a sensor signal according to the variation of the operation environment further comprises:

outputting the sensor signal according to an operation environment temperature variation.

10. The method of claim 7, wherein the electronic element comprises a memory array circuit.

* * * * *